United States Patent [19]

Cowan, Jr. et al.

[11] Patent Number: 4,778,549

[45] Date of Patent: Oct. 18, 1988

[54] CATALYSTS FOR ACCELERATING BURNOUT OR ORGANIC MATERIALS

[75] Inventors: James H. Cowan, Jr., Corning; Frederick E. Noll, Big Flats; Lloyd G. Young, Corning, all of N.Y.

[73] Assignee: Corning Glass Works, Corning, N.Y.

[21] Appl. No.: 37,833

[22] Filed: Apr. 13, 1987

[51] Int. Cl.$^4$ .................. B32B 18/00; B32B 31/24
[52] U.S. Cl. .................. 156/89; 264/61; 264/63; 427/96
[58] Field of Search .................. 156/89; 264/61, 63; 427/96; 501/2, 11, 15, 17, 20

[56] References Cited

U.S. PATENT DOCUMENTS

| | | | |
|---|---|---|---|
| 4,234,367 | 11/1980 | Herron et al. | 156/89 |
| 4,267,074 | 5/1981 | Holmes et al. | 264/63 |
| 4,340,618 | 7/1982 | Fury et al. | 427/96 |
| 4,415,624 | 11/1983 | Prabhu et al. | 427/96 |
| 4,474,731 | 10/1984 | Brownlow et al. | 264/63 |
| 4,547,625 | 10/1985 | Tosaki et al. | 427/96 |
| 4,627,160 | 12/1986 | Herron et al. | 156/89 |
| 4,649,125 | 3/1987 | Takeuchi et al. | 264/61 |

FOREIGN PATENT DOCUMENTS 1046088  3/1986  Japan .................. 264/61

*Primary Examiner*—Caleb Weston
*Attorney, Agent, or Firm*—Clinton S. Janes, Jr.

[57] ABSTRACT

This invention relates to a method for accelerating the burnout of organic material from a glass, glass-ceramic, or ceramic body where the burnout is conducted in a gaseous, essentially non-oxidizing atmosphere. The invention comprises incorporating very minute amounts of a metal-containing material into the glass, glass-ceramic, or ceramic body to act as a catalyst in the burnout process. Metals operable as catalysts include Ru, Rh, Pd, Os, Ir, and Pt.

18 Claims, No Drawings

CATALYSTS FOR ACCELERATING BURNOUT OR ORGANIC MATERIALS

BACKGROUND OF THE INVENTION

This invention is based upon the discovery of certain materials which act as catalysts to increase the rate at which organic materials can be burned out in essentially non-oxidizing atmospheres, i.e., atmospheres containing very low levels of oxygen, e.g., <25 ppm oxygen. One particular application for the invention contemplates the use of the catalysts in the fabrication of microelectronic circuits prepared through thick-film technology. Most advantageously, the catalysts are employed in the fabrication of such circuits where copper metal constitutes the thick-film conductor.

In the most general terms, the preparation of thick-film circuits comprises applying a paste, commonly termed an ink, containing a conducting material onto a ceramic substrate by means of a screen or mask ("printing") and then firing the coated substrate to adhere the paste to the substrate. Because of its excellent insulating properties and stability, and relatively high thermal conductivity and strength, alumina ($Al_2O_3$) has been widely used in the fabrication of such substrates. Nevertheless, because of the relatively high dielectric constant of $Al_2O_3$ ($\approx 10$), substrates prepared therefrom are subject to significant signal propagation delays and noise when used in certain high performance applications. Moreover and very importantly, the high maturing or sintering temperatures of $Al_2O_3$ ($\approx 1600°$ C.) severely limit the selection of co-sinterable conducting metallurgies to highly refractory metals such as molybdenum, palladium, platinum, and tungsten. That is, metals such as copper, gold, and silver which exhibit much greater electrical conductivity cannot be used because their melting points are far below 1600° C.

Those intrinsic drawbacks of $Al_2O_3$ have led to the development of glass-ceramic substrates. Such bodies are prepared from glass powders which are sintered together and exhibit the capability of crystallizing in situ during the sintering firing. Thermally devitrifiable glass compositions have been developed which can be sintered into non-porous bodies and crystalized in situ at atmospheres below 1000° C. Examples of such compositions can be found in U.S. Pat. No. 4,234,367 and U.S. Pat. No. 4,301,324, wherein the predominant crystal phase developed is either β-spodumene solid solution of cordierite, and in U.S. application Ser. No. 923,432, filed Oct. 27, 1986, U.S. Pat. No 4,714,687, in the names of Louis M. Holleran and Francis W. Martin, wherein the predominant crystal phase developed is willemite with, optionally, cordierite.

Customarily, the fabrication of microelectronic circuits contemplates interconnected multilayer substrates consisting of sintered glass-ceramic insulator and conducting patterns made of thick-film gold, silver, or copper. Interconnections between buried conductor layers can be achieved through vias comprising metal paste-filled holes in the individual laminae formed prior to lamination which will, upon sintering, become densely sintered metal interconnections. The production of such multilayer glass-ceramic substrates commonly involves the following eight general steps:

(a) Glass of a chosen composition is comminuted to a very fine powder, typically to particle sizes less than 10 microns.

(b) A slurry of that powder is prepared by admixing the powder in an organic vehicle system consisting, in general, of a binder, e.g., polyvinyl butyral, solvents, e.g., toluene and ethanol, and a surfactant, e.g., phosphate ester. Steps (a) and (b) may be combined, if desired, by milling the glass in the organic vehicle.

(c) The slurry is cast into thin green sheets in accordance with conventional techniques, for example, by doctor blading.

(d) The cast sheets are cut to desired dimensions and vias formed therein in predetermined configurations.

(e) A metallizing paste of gold, silver, or copper is deposited into the vias of the sheets, for example, by screen printing.

(f) The desired conductor patterns are applied onto the sheets; again, for example, by screen printing.

(g) A plurality of the sheets are laminated together in registry. The temperature and pressure employed for lamination are designed to cause the individual green sheets to bond together into an integral monolithic green substrate, and to cause the green ceramic to flow adequately to enclose the conductor patterns.

(g) The laminated substrate is fired to a temperature and for a time sufficient to burn out the organic components, and the temperature then raised to cause the sintering together of the glass particles with their concurrent conversion into glass-ceramic bodies through crystallization in situ, and the sintering together of the metal particles in the conductor patterns to dense metal lines and vias.

Silver and gold conducting pastes can be fired in an air atmosphere. Nevertheless, because of the characteristic tendency of silver to diffuse into the glass-ceramic and its apparent proclivity to cause electromigration problems, and because of the extremely high cost of gold, copper-containing pastes have customarily constituted the economic choice. Unfortunately, however, copper exhibits a high oxidizing potential, which attribute requires multilayer structures containing copper pastes to be sintered in neutral or reducing environments. Disadvantageously, reducing atmospheres have been observed to occasion adhesion problems; accordingly, neutral environments have been deemed preferable. Nonetheless, although operable in preventing the oxidation of copper, a neutral atmosphere, e.g., nitrogen, argon, and/or helium, does not provide an oxidizing agent capable of removing the carbon-based (organic) vehicle efficiently. That is, in the absence of an oxidizing agent, the organic components pyrolyze as the substrates are fired.

This situation has led to numerous schemes for controlling the atmosphere by limiting the oxygen content thereof. For example, each of U.S. Pat. Nos. 3,726,006, 4,296,272, 4,311,730, 4,313,262, and 4,517,155 demonstrates the use of oxygen in restricted amounts to oxidize the volatilized constituents of the organic vehicle system and remove them from the burnout chamber, or the use of small amounts of oxygen to produce a resistor by oxidizing the material deposited on the substrate. Still other attempts to solve the burnout problem inherent in the use of inert atmospheres through control of the components thereof or through control of the composition of the thick film are illustrated in U.S. Pat. Nos. 4,409,261 and 4,122,232. Finally, U.S. Pat. No. 4,622,240 discloses the use of an atmosphere of nitrogen containing 10–10,000 ppm nitrous oxide ($N_2O$) in the burnout environment.

The period of time required to burn out the organic vehicle system in copper-containing, thick-film atmosphere in a burnout chamber. Self-evidently, then, a reduction in firing time would result in a significant cost saving.

Therefore, the principal objective of the present invention was to devise means for accelerating the rate of burnout of organic materials in a gaseous, essentially non-oxidizing atmosphere. Most specifically, the instant invention was designed to provide means for increasing the rate of burnout of the organic components from multilayer microelectronic circuit packages utilizing glass-ceramic substrates and copper-containing pastes when such packages are fired in a gaseous, essentially non-oxidizing atmosphere.

SUMMARY OF THE INVENTION

We have found that those objectives can be achieved through the use of very minute amounts of a heavy metal from Group 8 of the Periodic Table (the platinum metals), i.e., a metal selected from the group consisting of ruthenium (Ru), rhodium (Rh), palladium (Pd), osmium (Os), iridium (Ir), and platnium (Pt) as a catalyst. We have discovered that the presence of at least one of those metals in any measurable amount is effective to enhance the organic burnout rate. In general, however, levels or about 2 ppm (parts per million) total of one or more of those metals have exhibited significant acceleration in burnout rate, with improved activity being observed up to about 100 ppm. Higher concentrations of the metals may be employed, but the improvement in rate of burnout is normally not sufficient to justify the added cost of the very expensive mtals. A preferred range of concentrations is about 10–50 ppm.

As was described above, multilayer glass-ceramic substrates are prepared in accordance with the following general steps:

(1) a glass-forming batch of a desired composition is prepared;
(2) that batch is melted and cooled to a glass;
(3) that glass is comminuted to a very fine powder;
(4) a slurry of the powder is prepared in an organic vehicle system;
(5) the slurry is formed into thin green sheets;
(6) those sheets are cut to desired dimensions and vias formed therein;
(7) metallizing paste is applied to the sheets and in the vias;
(8) the coated sheets are laminated together to form an integral monolithic substrate;
(9) the laminated substrate is fired to burn out the organic vehicle system; and
(10) the temperature is raised to sinter the glass particles together and simultaneously crystallize the glass in situ to a glass-ceramic.

Laboratory experimentation has demonstrated that the enhancement in rate of organic burnout can be achieved where the metal is incorporated in any of the following methods.

(A) The most efficient mode contemplates dissolving the metal in the form of a metal compound in an amount calculated to yield the desired concentration of metal into the vehicle system and then contacting the glass particles with that solution. This practice insures that each glass particle is coated and the metal is available for the required catalytic action. This solution can be carried out in accordance with two general procedures. To illustrate:

(1) The metal compound may be dissolved directly into the organic vehicle system either prior to, concurrently with, or subsequently to the glass powder being admixed into and/or comminuted in the organic vehicle system.

(2) The metal compound may first be dissolved into a polar organic solvent, the glass powder optionally being admixed into and/or comminuted in the solvent. A polar liquid is preferred because it retains the glass particles in suspension, thereby insuring complete surface wetting of the particles. Thereafter, two alternative practices are possible. In the first practice, the solvent with the glass particles therein is dried and the coated glass particles subsequently mixed into the organic vehicle system. In the second practice, the solvent with the metal compound dissolved therein is dissolved into the organic vehicle system. The glass particles may optionally be admixed into and/or comminuted in the solvent or may be admixed into and/or comminuted in the solvent/system solution.

As illustrative of this second procedure, rhodium chloride may be dissolved in an alcohol, e.g., methanol, ethanol, or isopropanol, the glass powder admixed and/or comminuted therein, and the alcohol eveporated away. Thereafter, the coated glass particles may be mixed into the organic binder system.

Experience has indicated that this second procedure frequently results in a more rapid and more complete solution of the metal compound in the organic vehicle system than where solution of the compound directly into the vehicle system is undertaken. The first practice of this section procedure comprises the most preferred embodiment.

It will be appreciated, of course, that an aqueous solution of the metal compound may be made, the glass powder mixed into and/or comminuted in that solution, the glass powder dried, and the so-coated glass powder then mixed into the organic vehicle. The practical problems involved in rapidly vaporizing water off a slurry, however, have discouraged this practice, although it is technically feasible.

(B) A somewhat less efficient procedure involves incorporating the metal as part of the glass composition. This can be accomplished in two ways. First, the metal, again normally in the form of a metal compound, is included in the original glass-forming batch such that, upon melting the batch, it becomes part of the glass. Second, the metal may become part of the glass through introduction as an impurity. For example, when a platinum-rhodium melting unit is used, corrosion of the metal can be sufficient to cause the migration of platinum and rhodium ions into the glass. Because the metal is incorporated in the glass, it is less available to act with respect to the organic vehicle system.

(C) A still less efficient practice consists of adding the metal or metal compound as an insoluble powder to the slurry of glass powder. A truly homogeneous dispersion of the metal is virtually impossible to achieve such that action between the metal and the organic vehicle system can be inconsistent.

DESCRIPTION OF PREFERRED EMBODIMENTS

In order to test the effectiveness of the metals as catalysts to accelerate the rate of burnout of organic materials in gaseous, essentially non-oxidizing atmospheres, circular pellets having a diameter of 0.5" and weighing about 3–4 grams consisting of 10 parts of powdered glass, glass-ceramic, or ceramic and 1 part organic binder were pressed in steel molds at pressures of 5000 psi. An electricall-heated, tube-type furnace using a stainless steel retort comprised the firing chamber. Purified nitrogen having a flow rate ranging over about 3–6 liters/minute was bubbled through a bath of distilled water operating at 120° F. ($\approx$49° C.) to provide an atmosphere of wet nitrogen. Such an atmosphere has been widely used commercially (U.S. Pat. No. 4,234,367, supra). Because of the differences in the sintering characteristics of the glass, glass-ceramic, and ceramic materials, and in the burnout characteristics of the binders, four distinct heat treating schedules were employed. All of the schedules were similar, however, in utilizing binder burnout at temperatures between 700°–800° C. That temperature interval was selected because readily recognizable results were obtained within about 2–7 hours; lower temperatures most probably would have required longer dwell periods. The four heating schedules are set out below.

Schedule 1 comprised heating from room temperature (R.T.) to 785° C. at 3° C./minute, maintaining that temperature for 7 hours, heating to 965° C. at 3° C./minute, holding that temperature for 2 hours, and then cutting off the electric current to the furnace with the samples retained therein. This "cooling at furnace rate" averaged about 5° C./minute.

Schedule 2 consisted of heating from R.T. to 785° C. at 3° C./minute, holding that temperature for 7 hours, and then cooling at furnace rate.

Schedule 3 involved heating from R.T. to 785° C. at 3° C./minute, maintaining thereafter for 4 hours, and then cooling at furnace rate.

Schedule 4 utilized heating from R.T. to 750° C. at 3° C./minute, holding that temperature for 7 hours, and then cooling at furnace rate.

The occurrence of enhanced organic binder burnout was readily observed visually. Samples with and without metal additives were fired concurrently. Samples without metal additives exhibited a gray appearance due to carbon residue therein. In contrast, samples evidencing accelerated burnout exhibited a white or near white appearance.

In the following examples either polyvinylbutyral (PVB) or ethyl cellulose (EC) constituted the organic binder. Furthermore, in the following examples Material A comprised a cordierite-containing glass-ceramic of the type described in U.S. Pat. No. 4,301,324; Material B comprised a Ba-osumilite-containing glass-ceramic of the type described in U.S. Pat. No. 4,464,475; Material C comprised an anorthite-containing glass-ceramic of the type described in U.S. Pat. No. 4,615,987; Material D comprised a willemite-containing glass-ceramic of the type described in U.S. patent application Ser. No. 923,432, filed Oct. 27, 1986 in the names of Louis M. Holleran and Francis W. Martin; Material E comprised Corning 9608, a beta-spodumene-containing glass-ceramic marketed by Corning Glass Works, Corning, New York under the trademark CORNING WARE; Material F comprised a cordierite-containing glass-ceramic of the type described in U.S. Pat. No. 4,015,048; Material G comprised a beta-spodumene-containing glass-ceramic of the type described in U.S. Pat. No. 4,301,324; Material H comprised a $BPO_4$-containing glass-ceramic of the type described in U.S. Pat. No. 4,576,920; Material I comprised powdered $Al_2O_3$; and Material J comprised Corning 1723; an alkaline earth metal aluminosilicate glass marketed by Corning Glass Works.

The cordierite-containing glass-ceramics described in U.S. Pat. No. 4,301,324 are stated to consist essentially, in weight percent, of about:

| $SiO_2$ | 48–55 | $P_2O_5$ | 0–3 |
|---|---|---|---|
| $Al_2O_3$ | 18–23 | $TiO_2$ | 0–2.5 |
| MgO | 18–25 | $SnO_2$ | 0–2.5 |
| ZnO | 0–2 | $ZrO_2$ | 0–2.5 |
| $Li_2O$ | 0–1 | $TiO_2 + SnO_2 + ZrO_2$ | 0–5 |
| $B_2O_3$ | 0–3 | | |

The beta-spodumene-containing glass-ceramics described in U.S. Pat. No. 4,301,324 are stated to consist essentially, in weight percent, of about:

| $SiO_2$ | 65–75 | CaO and/or BaO | 0–2 |
|---|---|---|---|
| $Al_2O_3$ | 12–17 | $Na_2O$ and/or $K_2O$ | 1–3.5 |
| MgO | 0–2 | $P_2O_5$ | 0–2.5 |
| ZnO | 0–2 | $TiO_2$ | 0–3 |
| $Li_2O$ | 3.5–11 | F | 0–3 |
| $B_2O_3$ | 0–2.5 | | |

The Ba-osumilite-containing glass-ceramics described in U.S. Pat. No. 4,144,475 are stated to consist essentially, in weight percent, of about:

| $SiO_2$ | 51–68 | $Nb_2O_5$ | 0–20 |
|---|---|---|---|
| $Al_2O_3$ | 17.5–30 | $Ta_2O_5$ | 0–10 |
| MgO | 5–12 | $TiO_2$ | 0–12 |
| BaO | 3.5–15 | $ZrO_2$ | 0–6 |
| Si | 0–1 | | |

The anorthite-containing glass-ceramics described in U.S. Pat. No. 4,615,987 are stated to consist essentially, in weight percent, of about:

| CaO | 0–25 | MgO | 0–15 |
|---|---|---|---|
| SrO | 0–30 | $Na_2O$ | 0–4 |
| CaO + SrO | 10–30 | $K_2O$ | 0–6 |
| $Al_2O_3$ | 25–38 | $TiO_2$ | 0–12 |
| $SiO_2$ | 35–60 | $ZrO_2$ | 0–15 |
| BaO | 0–25 | $As_2O_3$ | 0–3 |
| $BaO + MgO + Na_2O + K_2O + TiO_2 + ZrO_2 + As_2O_3$ | | | 0–30 |

Corning 9608 glass-ceramic has the approximate composition, in weight percent, of about

| $SiO_2$ | 70 | MgO | 3 |
|---|---|---|---|
| $Al_2O_3$ | 18 | ZnO | 1 |
| $Li_2O$ | 3 | $TiO_2$ | 5 | which is included within the beta-spodumene-containing glass-ceramics described in U.S. Pat. No. 3,157,522. The compositions disclosed in that patent are stated to consist essentially, in weight percent, of about:

| $SiO_2$ | 55–75 | $TiO_2$ | 3–7 |
|---|---|---|---|
| $Al_2O_3$ | 12–36 | $SiO_2 + Al_2O_3 + Li_2O + TiO_2$ | $\geq$95 |
| $Li_2O$ | 2–15 | | |

The cordierite-containing glass-ceramics described in U.S. Pat. No. 4,015,048 are stated to consist essentially, in mole percent, of about:

| MgO | 22.2–26 | MO | 0.7–5.6 |

-continued

| | | | | |
|---|---|---|---|---|
| $Al_2O_3$ | 23.6–27.8 | MgO + MO | $\geq 23.6$ |
| $SiO_2$ | 44.3–52.7 | | | wherein MO=BaO and/or PbO and/or SrO and/or CaO.

The $BPO_4$-containing glass-ceramics described in U.S. Pat. No. 4,576,920 are stated to consist essentially, in weight percent, of about:

| | | | |
|---|---|---|---|
| $SiO_2$ | 10–50 | $P_2O_5$ | 25–75 |
| $B_2O_3$ | 5–35 | $SiO_2 + B_2O_3 + P_2O_5$ | >90 |

Corning 1723 glass has the approximate composition, in weight percent, of about

| | | | |
|---|---|---|---|
| $SiO_2$ | 57 | MgO | 7 |
| $Al_2O_3$ | 16 | CaO | 10 |
| $B_2O_3$ | 4 | BaO | 6 | which is included within the alkaline earth alumino-silicate glasses described in U.S. Pat. No. 3,496,401. The compositions disclosed in that patent are stated to consist essentially, in weight percent, of about

| | | | |
|---|---|---|---|
| $SiO_2$ | 55–70 | alkaline earth metal oxide | 10–25 |
| $Al_2O_3$ | 13–25 | $B_2O_3$ | 0–10 |

The willemite-containing glass-ceramics described in U.S. application Ser. No. 923,432 are stated to consist essentially, in weight percent, of about:

| | | | |
|---|---|---|---|
| $SiO_2$ | 30–55 | MnO | 0–15 |
| $Al_2O_3$ | 10–30 | MgO | 0–15 |
| ZnO | 15–45 | $Cs_2O$ | 0–7 |
| $B_2O_3$ | 0–5 | CaO and/or SrO and/or BaO and/or PbO | 0–5 |
| | | CaO and/or SrO and/or BaO and/or PbO + $B_2O_3$ + $Cs_2O$ + MgO + MnO | 0–15 |

TABLE

| Material | Additive | Batch | Slurry | Binder | H.T. | Burnout |
|---|---|---|---|---|---|---|
| A | None | — | — | PVB | 1 | Poor |
| A | None | — | — | EC | 1 | Poor |
| A | $PdCl_2$ (20 ppm) | X | — | PVB | 1 | Poor |
| A | $Pd(C_5H_7O_2)_2$ (20 ppm) | — | X | PVB | 1 | Poor |
| A | $PdCl_2$ (20 ppm) | X | — | EC | 2 | Poor |
| A | $Pd(C_5H_7O_2)_2$ (20 ppm) | — | X | EC | 1 | Good |
| A | $RuO_2$ (26 ppm) | X | — | PVB | 1 | Good |
| A | $RuCl_3.3H_2O$ (20 ppm) | — | X | PVB | 1 | Good |
| A | $RuO_2$ (26 ppm) | X | — | EC | 2 | Good |
| A | $RuCl_3.3H_2O$ (20 ppm) | — | X | EC | 1 | Good |
| A | $OsO_2$ (24 ppm) | X | — | PVB | 1 | Poor |
| A | $OsCl_3$ (20 ppm) | — | X | PVB | 1 | Good |
| A | $OsO_2$ (24 ppm) | X | — | EC | 2 | Poor |
| A | $OsCl_3$ (20 ppm) | — | X | EC | 1 | Good |
| A | $IrCl_3$ (32 ppm) | X | — | PVB | 1 | Good |
| A | $IrCl_3$ (10 ppm) | — | X | PVB | 1 | Good |
| A | $IrCl_3$ (32 ppm) | X | — | EC | 2 | Good |
| A | $IrCl_4.XH_2O$ (10 ppm) | — | X | EC | 1 | Good |
| A | $Rh_2O_3$ (24 ppm) | X | — | PVB | 1 | Good |
| A | $RhCl_3.3H_2O$ (10 ppm) | — | X | PVB | 1 | Good |
| A | $RhCl_3.3H_2O$ (20 ppm) | — | X | PVB | 1 | Good |
| A | $RhCl_3.3H_2O$ (40 ppm) | — | X | PVB | 1 | Good |
| A | $Rh_2O_3$ (24 ppm) | X | — | EC | 2 | Good |
| A | $RhCl_3.3H_2O$ (10 ppm) | — | X | EC | 1 | Good |
| A | $PtCl_4$ (20 ppm) | X | — | PVB | 1 | Poor |
| A | $Pt(C_5H_7O_2)_2$ (20 ppm) | — | X | PVB | 1 | Good |
| A | $Pt(C_5H_7O_2)_2$ (20 ppm) | — | X | EC | 1 | Good |
| A | $Co_3O_4$ (30 ppm) | X | — | PVB | 1 | Poor |
| A | $Co(NO_3)_2.6H_2O$ (20 ppm) | — | X | PVB | 1 | Poor |
| A | $Co_3O_4$ (30 ppm) | X | — | EC | 1 | Poor |
| A | $Co(NO_3)_2.6H_2O$ (20 ppm) | — | X | EC | 1 | Poor |
| A | NiO (30 ppm) | X | — | PVB | 1 | Poor |
| A | $NiCl_2.6H_2O$ (20 ppm) | — | X | PVB | 1 | Poor |
| A | NiO (30 ppm) | X | — | EC | 1 | Poor |
| A | $NiCl_2.6H_2O$ (20 ppm) | — | X | EC | 1 | Poor |
| A | $Fe_2O_3$ (0.74%) | X | — | PVB | 1 | Poor |
| A | $FeCl_2.4H_2O$ (20 ppm) | — | X | PVB | 1 | Poor |
| A | $FeCl_2.4H_2O$ (20 ppm) | — | X | EC | 1 | Poor |
| B | None | — | — | PVB | 2 | Poor |
| B | $RhCl_3$ (20 ppm) | X | — | PVB | 2 | Good |
| B | $RhCl_3.3H_2O$ (20 ppm) | — | X | PVB | 3 | Good |
| C | None | — | — | PVB | 2 | Poor |
| C | $RhCl_3$ (20 ppm) | X | — | PVB | 2 | Good |
| C | $RhCl_3.3H_2O$ (20 ppm) | — | X | PVB | 3 | Good |
| D | None | — | — | PVB | 2 | Poor |
| D | $RhCl_3$ (20 ppm) | X | — | PVB | 2 | Good |
| D | $RhCl_3.3H_2O$ (20 ppm) | — | X | PVB | 3 | Good |
| E | None | — | — | PVB | 2&3 | Poor |
| E | None | — | — | EC | 3 | Poor |
| E | $RhCl_3$ (20 ppm) | X | — | PVB | 2 | Good |
| E | $RhCl_3.3H_2O$ (10 ppm) | — | X | EC | 3 | Good |
| E | $RhCl_3.3H_2O$ (10 ppm) | — | X | PVB | 3 | Good |
| F | None | — | — | PVB | 1 | Poor |
| F | $RhCl_3$ (8 ppm) | X | — | PVB | 1 | Good |
| F | $RhCl_3.3H_2O$ (10 ppm) | — | X | PVB | 1 | Good |
| G | $RhCl_3$ (20 ppm) | X | — | PVB | 3 | Good |
| G | $RhCl_3$ (20 ppm) | X | — | EC | 3 | Good |
| H | None | — | — | PVB | 2 | Poor |
| H | $RhCl_3.3H_2O$ (20 ppm) | — | X | PVB | 2 | Good |
| I | None | — | — | EC | 4 | Poor |
| I | $RhCl_3.3H_2O$ (10 ppm) | — | X | EC | 4 | Good |
| J | None | — | — | PVB | 3 | Poor |
| J | $RhCl_3.3H_2O$ (20 ppm) | — | X | PVB | 3 | Good |

A circular pellet pressed from a mixture of powdered $Al_2O_3$ (Material I) and an epoxy binder demonstrated poor burnout when subjected to heat treating Schedule 4 in a flowing wet nitrogen atmosphere, but, when $RhCl_3.3H_2O$ in an amount so calculated that 10 ppm rhodium was incorporated, excellent burnout was exhibited.

Rhodium (III) 2,4-pentanedionate [$Rh(C_5H_7O_2)_3$] was dissolved in methanol [$CH_3OH$] and that solution blended into PVB to form a binder system calculated to yield 20 ppm rhodium per weight of glass when the liquid was added to powdered glass. After the solution was added to powdered Material A, the mixture was rolled in a jar mill for 20 minutes, the methanol evaporated by heating the mixture at about 50° C. in a flow of air, and the resulting mixture ground to a coarse powder, i.e., powder >10 microns in diameter. Circular pellets were pressed wherein the glass:binder ratio was 10:1 by weight. When the pellets were fired according to Schedule 1 in a flowing wet nitrogen atmosphere, excellent burnout was demonstrated.

As can be observed from the above, the platinum, metals, i.e., Ru, Rh, Pd, Os, Ir, and Pt, are effective in varying degrees in catalyzing the burnout of organic materials in gaseous, essentially non-oxidizing atmospheres. Rhodium appears to be the most effective and, hence, is the preferred catalyst. The metals seem to perform equally well with glasses, glass-ceramics, and ceramics; the one obvious requirement being that the sintering temperatures of the glasses, glass-ceramics, and ceramics are higher than the burnout temperature of the organic material.

To illustrate the effectiveness of the catalysts in reducing the time of burnout, several circular pellets were pressed from a mixture of Material A in polyvinylbutyral as the binder. A matrix of experiments was designed utilizing rhodium calculated in amounts of 10 ppm, 20 ppm, and 40 ppm and firing Schedule A, except that dwell times at 785° C. of 2, 4, and 8 hours were used. At the 10 ppm rhodium level, complete binder burnout occurred at about 8 hours; at the 20 ppm rhodium level, complete burnout was accomplished in about 6 hours; at the 40 ppm rhodium level, complete burnout was achieved in about 4 hours.

Such reduction in time necessary for burnout is, self-evidently, very valuable from a commercial point of view. It enables the production of desired products to be carried out more rapidly and less expensively.

We claim:

1. A method for accelerating the burnout in a wet, gaseous, inert atmosphere containing a very low level of oxygen of organic material from a body prior to sintering said body, said body comprising said organic material and an inorganic material selected from the group consisting of glasses, glass-ceramics, and ceramics, by incorporating in said body an effective amount of at least one metal-containing material wherein said metal is selected from the group consisting of Ru, Rh, Pd, Os, Ir, and Pt.

2. A method according to claim 1 wherein at least one metal-containing material is incorporated in an amount calculated to be equivalent to at least about 2 ppm total of said metals.

3. A metal according to claim 2 wherein said metal-containing material is incorporated in an amount calculated to be equivalent to at least about 2-100 ppm of metal.

4. A method according to claim 1 wherein said metal-containing material is incorporated in a batch which is then melted and formed into a glass body.

5. A method according to claim 4 wherein said glass body is crystallized in situ to a glass-ceramic body.

6. A method according to claim 1 wherein said metal-containing material is incorporated in a glass body as an impurity from the glass melting unit.

7. A method according to claim 6 wherein said glass body is crystallized in situ to a glass ceramic body.

8. A method according to claim 1 wherein said metal-containing material is incorporated in said body in particulate form.

9. A method according to claim 1 wherein said metal-containing material is incorporated in said body in solution with said organic material.

10. A method for fabricating microelectronic circuits consisting of interconnected, multilayer glass-ceramic substrates with conducting patterns and interconnecting vias produced from copper-containing thick-film inks comprising the steps of:
    (a) preparing a glass-forming batch of a desired composition;
    (b) melting said batch;
    (c) cooling said batch to a glass
    (d) comminuting said glass to very fine particles;
    (e) preparing a slurry of said glass particles in an organic vehicle system;
    (f) forming said slurry into thin green sheets;
    (g) cutting said sheets to desired dimensions and forming vias therein;
    (h) applying copper-containing, thick-film ink to said sheets and in said vias;
    (i) laminating said sheets together to form an integral monolithic substrate;
    (j) heating said substrate in a wet, gaseous, inert atmosphere containing avery low level of oxygen to a temperature and for a time sufficient to burn out said organic vehicle system; and
    (k) heating said substrate to a higher temperature for a time sufficient to sinter said glass particles together and simultaneously crystallize the glass in situ to a glass-ceramic;
    the improvement comprising accelerating the rate of burnout of said organic vehicle system by incorporating an effective amount of at least one metal-containing material into said thin green sheets, said metal being selected from the group consisting of Ru, Rh, Pd, Os, Ir, and Pt.

11. A method according to claim 10 wherein at least one metal-containing material is incorporated in an amount calculated to be equivalent to at least about 2 ppm total of said metals.

12. A method according to claim 11 wherein at least one metal-containing material is incorporated in an amount calculated to be equivalent to at least about 2-100 ppm total of said metals.

13. A method according to claim 10 wherein said metal-containing material is incorporated in said glass-forming batch.

14. A method according to claim 10 wherein said metal-containing material is incorporated in said glass as an impurity from the glass melting unit.

15. A method according to claim 10 wherein said metal-containing material is incorporated in particulate form in said slurry.

16. A method according to claim 10 wherein said metal-containing material is incorporated in solution with said organic vehicle system.

17. A method according to claim 10 wherein the crystal phase present in said glass-ceramic is selected from the group consisting of cordierite, Ba-osumilite, anorthite, willemite, beta-spodumene, and $BPO_4$.

18. A method according to claim 10 wherein said organic vehicle system contains a binder selected from the group consisting of polyvinylbutyral, ethyl cellulose, and epoxy resin.

* * * * *

UNITED STATES PATENT AND TRADEMARK OFFICE
CERTIFICATE OF CORRECTION

PATENT NO. : 4,778,549
DATED : October 18, 1988
INVENTOR(S) : James H. Cowan, Jr. et al.

It is certified that error appears in the above-identified patent and that said Letters Patent is hereby corrected as shown below:

In the Title, change "OR" to --OF--.
Column 1, line 45, change "crystalized" to --crystallized--.
Column 1, line 48, change "of" to --or--.
Column 3, line 2, insert between "thick-film" and "atmosphere": --inks can be quite lengthy when inert gases comprise the--.
Column 3, line 33, change "mtals" to --metals--.
Column 4, line 32, change "section" to --second--.
Column 5, line 3, change "electricall" to --electrically--.
Column 5, line 32, change "thereaft" to --thereat--.
Column 5, line 55, delete "No.".
Column 5, line 68, change "1723;" to --1723,--.
Column 6, line 26, change "4,144,475" to --4,414,475--.
Column 10, line 27, change "avery" to --a very--.

Signed and Sealed this

Eighteenth Day of April, 1989

Attest:

DONALD J. QUIGG

Attesting Officer

Commissioner of Patents and Trademarks